United States Patent
Ali et al.

(10) Patent No.: US 9,331,723 B2
(45) Date of Patent: May 3, 2016

(54) PERTURBATION-BASED DYNAMIC MEASUREMENT OF ANTENNA IMPEDANCE IN REAL-TIME

(75) Inventors: Shirook M. Ali, Waterloo (CA); Michael Eoin Buckley, Rolling Meadows, IL (US); James P. Warden, Irving, TX (US); John B. Deforge, Ottawa (CA)

(73) Assignee: BlackBerry Limited, Waterloo, Ontario (CA)

( * ) Notice: Subject to any disclaimer, the term of this patent is extended or adjusted under 35 U.S.C. 154(b) by 169 days.

(21) Appl. No.: 14/357,404

(22) PCT Filed: Nov. 14, 2011

(86) PCT No.: PCT/US2011/060540
§ 371 (c)(1),
(2), (4) Date: May 9, 2014

(87) PCT Pub. No.: WO2013/074063
PCT Pub. Date: May 23, 2013

(65) Prior Publication Data
US 2014/0287698 A1    Sep. 25, 2014

(51) Int. Cl.
*H04B 1/04* (2006.01)
*H03H 7/40* (2006.01)

(52) U.S. Cl.
CPC ............... *H04B 1/0475* (2013.01); *H03H 7/40* (2013.01); *H04B 1/0458* (2013.01)

(58) Field of Classification Search
USPC .............................. 455/77, 192.3, 193.1, 125
See application file for complete search history.

(56) References Cited

U.S. PATENT DOCUMENTS 3,366,883 A    1/1968    Griffin et al.
3,590,385 A    6/1971    Sabo et al.
(Continued)

FOREIGN PATENT DOCUMENTS

EP    2037576 A2    3/2009
FR    2573940 A1    5/1986
(Continued)

OTHER PUBLICATIONS

Crespo et al., "An RF electronically controlled impedance tuning network design and its application to an antenna input impedance automatic matching system", IEEE Transactions on Microwave Theory and Techniques, vol. 52, Issue 2, Feb. 2004, 1 page—Abstract.

(Continued)

*Primary Examiner* — Nay A Maung
*Assistant Examiner* — Erica Fleming-Hall
(74) *Attorney, Agent, or Firm* — Conley Rose, P.C.; J. Robert Brown, Jr.

(57) ABSTRACT

Devices and methods are disclosed for real-time calibration of a tunable matching network that matches the dynamic impedance of an antenna in a receiver. Processing logic is operable to solve multiple non-linear equations to determine the reflection coefficient of the antenna. The tunable matching network is repeatedly perturbed and the power received by the antenna is measured after each perturbation at the same node in the matching network. The measured power values are used by an optimizer in converging to a solution that provides the reflection coefficient of the antenna. The reflection coefficient of the antenna may be used to determine the input impedance of the antenna. The elements of the matching circuit may then be adjusted to match the input impedance of the antenna.

20 Claims, 10 Drawing Sheets

(56) References Cited

U.S. PATENT DOCUMENTS

| | | | |
|---|---|---|---|
| 3,794,941 A * | 2/1974 | Templin | H03H 7/40 |
| | | | 324/619 |
| 4,165,493 A | 8/1979 | Harrington | |
| 4,739,329 A | 4/1988 | Ward et al. | |
| 5,564,086 A | 10/1996 | Cygan et al. | |
| 5,991,282 A | 11/1999 | Langlet et al. | |
| 6,262,684 B1 | 7/2001 | Stewart et al. | |
| 6,326,922 B1 | 12/2001 | Hegendoerfer | |
| 6,414,562 B1 | 7/2002 | Bouisse et al. | |
| 6,671,859 B1 | 12/2003 | Naylor et al. | |
| 6,757,423 B1 | 6/2004 | Amini | |
| 6,788,920 B1 | 9/2004 | Zamat | |
| 6,804,262 B1 | 10/2004 | Vogel et al. | |
| 6,895,225 B1 | 5/2005 | Talvitie et al. | |
| 7,071,776 B2 | 7/2006 | Forrester et al. | |
| 7,512,384 B2 | 3/2009 | Toda et al. | |
| 7,528,674 B2 | 5/2009 | Kato et al. | |
| 7,586,384 B2 | 9/2009 | Ranta | |
| 7,711,337 B2 | 5/2010 | Mckinzie, III et al. | |
| 7,756,486 B1 | 7/2010 | Tan et al. | |
| 7,831,219 B2 | 11/2010 | Heuermann et al. | |
| 7,865,154 B2 | 1/2011 | Mendolia et al. | |
| 7,917,104 B2 | 3/2011 | Manssen et al. | |
| 7,925,220 B2 | 4/2011 | Baker | |
| 7,933,574 B2 | 4/2011 | Rofougaran et al. | |
| 8,098,210 B2 | 1/2012 | Massey et al. | |
| 8,213,886 B2 | 7/2012 | Blin | |
| 8,310,309 B2 | 11/2012 | Behera et al. | |
| 8,326,234 B2 | 12/2012 | Bakalski et al. | |
| 8,472,905 B2 | 6/2013 | Rofougaran | |
| 8,543,071 B2 | 9/2013 | El Kaamouchi et al. | |
| 8,774,743 B2 * | 7/2014 | Ali | H01Q 3/267 |
| | | | 455/125 |
| 2003/0048223 A1 | 3/2003 | Kezys | |
| 2003/0184319 A1 | 10/2003 | Nishimori et al. | |
| 2004/0009754 A1 | 1/2004 | Smith, Jr. | |
| 2005/0146387 A1 | 7/2005 | Toda et al. | |
| 2006/0025088 A1 | 2/2006 | Pietig et al. | |
| 2006/0154617 A1 * | 7/2006 | Clingman | H01Q 3/44 |
| | | | 455/78 |
| 2006/0160501 A1 | 7/2006 | Mendolia et al. | |
| 2007/0010217 A1 | 1/2007 | Takahashi et al. | |
| 2007/0035356 A1 | 2/2007 | Ranta | |
| 2007/0149146 A1 | 6/2007 | Hwang et al. | |
| 2007/0155347 A1 | 7/2007 | Heuermann et al. | |
| 2007/0197180 A1 | 8/2007 | McKinzie, III et al. | |
| 2008/0077361 A1 | 3/2008 | Boyd et al. | |
| 2008/0180345 A1 | 7/2008 | Larson et al. | |
| 2008/0180346 A1 | 7/2008 | Rofougaran | |
| 2008/0214125 A1 | 9/2008 | Haque et al. | |
| 2008/0261544 A1 | 10/2008 | Blin | |
| 2009/0011732 A1 | 1/2009 | Bayruns | |
| 2009/0066440 A1 | 3/2009 | Chan Wai Po et al. | |
| 2009/0121963 A1 | 5/2009 | Greene | |
| 2009/0157334 A1 | 6/2009 | Goodnow et al. | |
| 2009/0161586 A1 | 6/2009 | Kasai et al. | |
| 2009/0179807 A1 | 7/2009 | Peng | |
| 2009/0237170 A1 * | 9/2009 | Van Zyl | H01J 37/32082 |
| | | | 331/127 |
| 2009/0267703 A1 * | 10/2009 | May | H03H 7/40 |
| | | | 333/32 |
| 2009/0267746 A1 | 10/2009 | Muchkaev | |
| 2009/0289735 A1 | 11/2009 | Womac | |
| 2010/0069011 A1 | 3/2010 | Carrick et al. | |
| 2010/0073103 A1 | 3/2010 | Spears et al. | |
| 2010/0289711 A1 | 11/2010 | Boyle et al. | |
| 2010/0317297 A1 | 12/2010 | Kratochwil et al. | |
| 2011/0075886 A1 | 3/2011 | Ashjaee et al. | |
| 2011/0086598 A1 * | 4/2011 | Ali | H01Q 3/267 |
| | | | 455/115.1 |
| 2011/0086600 A1 | 4/2011 | Muhammad | |
| 2011/0086601 A1 * | 4/2011 | Ali | H01Q 1/243 |
| | | | 455/121 |
| 2011/0163935 A1 | 7/2011 | de Jongh et al. | |
| 2011/0254637 A1 | 10/2011 | Manssen et al. | |
| 2012/0051409 A1 | 3/2012 | Brobston et al. | |
| 2012/0169565 A1 * | 7/2012 | Morris, III | H03F 1/565 |
| | | | 343/860 |
| 2012/0169566 A1 * | 7/2012 | Chan Wai Po | H03F 1/56 |
| | | | 343/860 |
| 2012/0217818 A1 * | 8/2012 | Yerazunis | H02J 5/005 |
| | | | 307/104 |
| 2012/0249260 A1 * | 10/2012 | Ho | H03H 7/38 |
| | | | 333/101 |
| 2013/0231155 A1 * | 9/2013 | Sheynman | H03G 3/20 |
| | | | 455/550.1 |
| 2013/0244589 A1 * | 9/2013 | Schmidhammer | H03H 7/40 |
| | | | 455/73 |
| 2014/0210686 A1 | 7/2014 | Ali et al. | |

FOREIGN PATENT DOCUMENTS

| | | | | |
|---|---|---|---|---|
| GB | 2469922 A * | 11/2010 | | H01Q 1/243 |
| WO | 2012067622 A1 | 5/2012 | | |

OTHER PUBLICATIONS

International Search Report and Written Opinion for PCT Application No. PCT/US2011/060540, dated Oct. 17, 2012, pp. 1-15.

Ali, Shirook M., et al.; U.S. Appl. No. 13/664,926, filed Oct. 31, 2012; Title: Adaptive Antenna Matching via a Transceiver-Based Perturbation Technique.

Ali, Shirook M., et al.; U.S. Appl. No. 12/579,381, filed Oct. 14, 2009; Title: Dynamic Real-Time Calibration for Antenna Matching in a Radio Frequency Receiver System.

Ali, Shirook M., et al.; U.S. Appl. No. 12/579,370, filed Oct. 14, 2009; Title: Dynamic Real-Time Calibration for Antenna Matching in a Radio Frequency Transmitter System.

Qiao, Dongjiang, et al.; "Antenna Impedance Mismatch Measurement and Correction for Adaptive CDMA Transceivers"; IEEE; 2005; 4 pages.

Parfitt, Andrew, et al.; "The Design of Active Receiving Antennas for Broadband Low-Noise Operation"; Proceedings of the XXVIIth URSI General Assembly in Maastricht; www.ursi.org/Proceedings/ProcGA02/papers/p1001.pdf; Aug. 2002; 4 pages.

Oh, Sung-Hoon, et al.; "Automatic Antenna-Tuning Unit for Software-Defined and Cognitive Radio"; Wireless Communications and Mobile Computing; Wiley InterScience; 2007; 13 pages.

Ogawa, Koichi, et al.; "An Analysis of the Performance of a Handset Diversity Antenna Influence by Head, Hand, and Shoulder Effects at 900 MHz: Part I—Effective Gain Characteristics"; IEEE Transactions on Vehicular Technology; vol. 50; No. 3; May 2001; 15 pages.

Bakr, Mohamed H., et al.; "Dynamic Real-Time Calibration for Antenna Matching in the Transmitting and Receiving Modes"; International Journal of RF and Microwave Computer-Aided Engineering; vol. 22; No. 1; Jan. 2012; 9 pages.

Toftgard, Jorn, et al.; "Effects on Portable Antennas of the Presence of a Person"; IEEE Transactions on Antennas and Propagation; vol. 41; No. 6; Jun. 1993; 8 pages.

WiSPRY; "WiSpry Programmable RF Silicon Solutions"; http://www.wispry.com/; Sep. 16, 2009; 1 page.

Paratek; "Adaptive RF: Iconic Phone's with No Compromises!"; http://www.paratek.com/; Sep. 16, 2009; 1 page.

Pozar, David M.; "Microwave Engineering"; Addison-Wesley Publishing Company; 1990; 12 pages.

Vian, James; "Double-Stub Impedance Matching Algorithm"; IEEE; 2007; 3 pages.

Press, William H., et al.; "Chapter 9: Root Finding and Nonlinear Sets of Equations"; Numerical Recipes in C: The Art of Scientific Computing; Second Edition; Cambridge University Press; Feb. 1993; 48 pages.

Oba, Hirokazu, et al.; "Adaptive Impedance Matching System Using FPGA Processor for Efficient Control Algorithm"; IEICE Transactions on Electronics; vol. E91.C; No. 8; Aug. 2008; 20 pages.

Chang, Kai, et al.; "Low-Cost Microwave/Millimeter-Wave Impedance Measuring Scheme Using a Three-Probe Microstrip Circuit"; IEEE Transactions on Microwave Theory and Techniques; Oct. 1990; 6 pages.

(56) References Cited

OTHER PUBLICATIONS

Office Action dated Jul. 30, 2014; U.S. Appl. No. 13/664,926, filed Oct. 31, 2012; 17 pages.
Notice of Allowance dated Nov. 21, 2014; U.S. Appl. No. 13/664,926, filed Oct. 31, 2012; 9 pages.
Office Action dated Dec. 15, 2011; U.S. Appl. No. 12/579,381, filed Oct. 14, 2009; 31 pages.
Final Office Action dated Mar. 30, 2012; U.S. Appl. No. 12/579,381, filed Oct. 14, 2009; 21 pages.
Advisory Action dated Jun. 8, 2012; U.S. Appl. No. 12/579,381, filed Oct. 14, 2009; 3 pages.
Office Action dated May 23, 2013; U.S. Appl. No. 12/579,381, filed Oct. 14, 2009; 16 pages.
Final Office Action dated Nov. 18, 2013; U.S. Appl. No. 12/579,381, filed Oct. 14, 2009; 18 pages.
Advisory Action dated Jan. 30, 2014; U.S. Appl. No. 12/579,381, filed Oct. 14, 2009; 3 pages.
Notice of Allowance dated Feb. 27, 2014; U.S. Appl. No. 12/579,381, filed Oct. 14, 2009; 12 pages.
Office Action dated Oct. 24, 2011; U.S. Appl. No. 12/579,370, filed Oct. 14, 2009; 15 pages.
Notice of Allowance dated Feb. 3, 2012; U.S. Appl. No. 12/579,370, filed Oct. 14, 2009; 16 pages.
European Extended Search Report; Application No. 13191162.0; Feb. 11, 2014; 8 pages.
PCT International Search Report; Application No. PCT/US2010/052648; Jan. 24, 2011; 6 pages.
PCT Written Opinion of the International Searching Authority; Application No. PCT/US2010/052648; Jan. 24, 2011; 9 pages.
PCT International Preliminary Report on Patentability; Application No. PCT/US2010/052648; Nov. 29, 2011; 7 pages.
European Examination Report; Application No. 10775964.9; Jul. 30, 2013; 8 pages.
PCT International Search Report; Application No. PCT/US2010/052651; Sep. 30, 2011; 4 pages.
PCT Written Opinion of the International Searching Authority; Application No. PCT/US2010/052651; Sep. 30, 2011; 6 pages.
Notice of Allowance dated Mar. 30, 2015; U.S. Appl. No. 13/664,926, filed Oct. 31, 2012; 21 pages.

* cited by examiner

US 9,331,723 B2

PERTURBATION-BASED DYNAMIC MEASUREMENT OF ANTENNA IMPEDANCE IN REAL-TIME

CROSS-REFERENCE TO RELATED APPLICATION

This application is a National Stage Application of PCT Application No. PCT/US2011/060540 filed Nov. 14, 2011, the disclosure of which is incorporated by reference herein in its entirety.

BACKGROUND OF THE DISCLOSURE

1. Field of the Disclosure

The present disclosure is directed in general to communication systems and, more specifically, to systems and methods for real-time measurement of antenna impedance.

2. Description of the Related Art

The environment in which a wireless communication system is located can have a significant impact on the performance of antennas associated with the system. In particular, the power radiated by an antenna is affected by its proximity to objects, as, for example, a human, a metal object, a building, or a combination of such objects. To maximize the performance of a wireless communication system, it is important to compensate for environmental factors that may affect the efficiency of the antenna.

It is especially advantageous to be able to determine the input impedance of the antenna in real time. For example, a change in the impedance may indicate a change in the channel that the wireless device is operating in. The change in the impedance information may be used to initiate a defined action. For example, in beam steering applications, the change in the antenna impedance value may indicate the need to initiate the beam steering process in search for a better link. In some applications, a known antenna input impedance value can be used to control tunable antenna components. Knowledge of the characteristics of the antenna impedance can also provide sense information regarding the near-field environment of the antenna (e.g., head, holster, etc.). Knowledge of the antenna input impedance in real-time can also be used to facilitate adaptive antenna impedance matching to compensate for the effects of the user.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
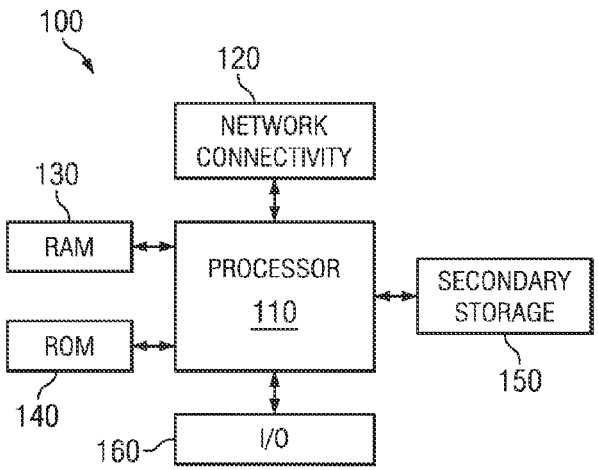
FIG. 1 depicts an exemplary system in which the present invention may be implemented.

Embodiments of the disclosure provide systems and methods for real-time measurement of the input impedance of an antenna. In one embodiment, the input impedance of an antenna is measured by perturbing the frequency of operation of a matching circuit coupled to the antenna. In another embodiment, the input impedance is measured by perturbing the frequency of operation of the matching circuit and also perturbing the components of the matching circuit. In another embodiment, each of the aforementioned techniques is implemented by performing the equivalent of frequency perturbation in a digital signal processor operating at digital baseband.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the inventor's specific goals, such as compliance with process technology or design-related constraints, which will vary from one implementation to another. While such a development effort might be complex and time-consuming, it would nevertheless be a routine undertaking for those of skill in the art having the benefit of this disclosure. For example, selected aspects are shown in block diagram and flowchart form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

As used herein, the terms "component," "system" and the like are intended to refer to a computer-related entity, either hardware, software, a combination of hardware and software, or software in execution. For example, a component may be, but is not limited to being, a processor, a process running on a processor, an object, an executable, a thread of execution, a program, or a computer. By way of illustration, both an application running on a computer and the computer itself can be a component. One or more components may reside within a process or thread of execution and a component may be localized on one computer or distributed between two or more computers.

As likewise used herein, the term "node" broadly refers to a connection point, such as a redistribution point or a communication endpoint, of a communication environment, such as a network. Accordingly, such nodes refer to an active electronic device capable of sending, receiving, or forwarding information over a communications channel. Examples of such nodes include data circuit-terminating equipment (DCE), such as a modem, hub, bridge or switch, and data terminal equipment (DTE), such as a handset, a printer or a host computer (e.g., a router, workstation or server). Examples of local area network (LAN) or wide area network (WAN) nodes include computers, packet switches, cable modems, Data Subscriber Line (DSL) modems, and wireless LAN (WLAN) access points. Examples of Internet or Intranet nodes include host computers identified by an Internet Protocol (IP) address, bridges and WLAN access points. Likewise, examples of nodes in cellular communication include base stations, relays, base station controllers, radio network controllers, home location registers, Gateway GPRS Support Nodes (GGSN), Serving GPRS Support Nodes (SGSN), Serving Gateways (S-GW), and Packet Data Network Gateways (PDN-GW).

Other examples of nodes include client nodes, server nodes, peer nodes and access nodes. As used herein, a client node may refer to wireless devices such as mobile telephones, smart phones, personal digital assistants (PDAs), handheld devices, portable computers, tablet computers, and similar devices or other user equipment (UE) that has telecommunications capabilities. Such client nodes may likewise refer to a mobile, wireless device, or conversely, to devices that have similar capabilities that are not generally transportable, such as desktop computers, set-top boxes, or sensors. Likewise, a server node, as used herein, refers to an information processing device (e.g., a host computer), or series of information processing devices, that perform information processing requests submitted by other nodes. As likewise used herein, a peer node may sometimes serve as client node, and at other times, a server node. In a peer-to-peer or overlay network, a node that actively routes data for other networked devices as well as itself may be referred to as a supernode.

An access node, as used herein, refers to a node that provides a client node access to a communication environment. Examples of access nodes include cellular network base stations and wireless broadband (e.g., WiFi, WiMAX, etc) access points, which provide corresponding cell and WLAN coverage areas. As used herein, a macrocell is used to generally describe a traditional cellular network cell coverage area. Such macrocells are typically found in rural areas, along highways, or in less populated areas. As likewise used herein, a microcell refers to a cellular network cell with a smaller coverage area than that of a macrocell. Such micro cells are typically used in a densely populated urban area. Likewise, as used herein, a picocell refers to a cellular network coverage area that is less than that of a microcell. An example of the coverage area of a picocell may be a large office, a shopping mall, or a train station. A femtocell, as used herein, currently refers to the smallest commonly accepted area of cellular network coverage. As an example, the coverage area of a femtocell is sufficient for homes or small offices.

In general, a coverage area of less than two kilometers typically corresponds to a microcell, 200 meters or less for a picocell, and on the order of 10 meters for a femtocell. As likewise used herein, a client node communicating with an access node associated with a macrocell is referred to as a "macrocell client." Likewise, a client node communicating with an access node associated with a microcell, picocell, or femtocell is respectively referred to as a "microcell client," "picocell client," or "femtocell client."

The term "article of manufacture" (or alternatively, "computer program product") as used herein is intended to encompass a computer program accessible from any computer-readable device or media. For example, computer readable media can include but are not limited to magnetic storage devices (e.g., hard disk, floppy disk, magnetic strips, etc.), optical disks such as a compact disk (CD) or digital versatile disk (DVD), smart cards, and flash memory devices (e.g., card, stick, etc.).

The word "exemplary" is used herein to mean serving as an example, instance, or illustration. Any aspect or design described herein as "exemplary" is not necessarily to be construed as preferred or advantageous over other aspects or designs. Those of skill in the art will recognize many modifications may be made to this configuration without departing from the scope, spirit or intent of the claimed subject matter. Furthermore, the disclosed subject matter may be implemented as a system, method, apparatus, or article of manufacture using standard programming and engineering techniques to produce software, firmware, hardware, or any combination thereof to control a computer or processor-based device to implement aspects detailed herein.

FIG. 1 illustrates an example of a system 100 suitable for implementing one or more embodiments disclosed herein. In various embodiments, the system 100 comprises a processor 110, which may be referred to as a central processor unit (CPU) or digital signal processor (DSP), network connectivity interfaces 120, random access memory (RAM) 130, read only memory (ROM) 140, secondary storage 150, and input/output (I/O) devices 160. In some embodiments, some of these components may not be present or may be combined in various combinations with one another or with other components not shown. These components may be located in a single physical entity or in more than one physical entity. Any actions described herein as being taken by the processor 110 might be taken by the processor 110 alone or by the processor 110 in conjunction with one or more components shown or not shown in FIG. 1.

The processor 110 executes instructions, codes, computer programs, or scripts that it might access from the network connectivity interfaces 120, RAM 130, or ROM 140. While only one processor 110 is shown, multiple processors may be present. Thus, while instructions may be discussed as being executed by a processor 110, the instructions may be executed simultaneously, serially, or otherwise by one or multiple processors 110 implemented as one or more CPU chips.

In various embodiments, the network connectivity interfaces 120 may take the form of modems, modem banks, Ethernet devices, universal serial bus (USB) interface devices, serial interfaces, token ring devices, fiber distributed data interface (FDDI) devices, wireless local area network (WLAN) devices, radio transceiver devices such as code division multiple access (CDMA) devices, global system for mobile communications (GSM) radio transceiver devices, long term evolution (LTE) radio transceiver devices, worldwide interoperability for microwave access (WiMAX) devices, and/or other well-known interfaces for connecting to networks, including Personal Area Networks (PANs) such as Bluetooth. These network connectivity interfaces 120 may enable the processor 110 to communicate with the Internet or one or more telecommunications networks or other networks from which the processor 110 might receive information or to which the processor 110 might output information.

The network connectivity interfaces 120 may also be capable of transmitting or receiving data wirelessly in the form of electromagnetic waves, such as radio frequency signals or microwave frequency signals. Information transmitted or received by the network connectivity interfaces 120 may include data that has been processed by the processor 110 or instructions that are to be executed by processor 110. The data may be ordered according to different sequences as may be desirable for either processing or generating the data or transmitting or receiving the data.

In various embodiments, the RAM 130 may be used to store volatile data and instructions that are executed by the processor 110. The ROM 140 shown in FIG. 1 may likewise be used to store instructions and data that are read during execution of the instructions. The secondary storage 150 is typically comprised of one or more disk drives or tape drives and may be used for non-volatile storage of data or as an overflow data storage device if RAM 130 is not large enough to hold all working data. Secondary storage 150 may likewise be used to store programs that are loaded into RAM 130 when such programs are selected for execution. The I/O devices 160 may include liquid crystal displays (LCDs), Light Emitting Diode (LED) displays, Organic Light Emitting Diode (OLED) displays, projectors, televisions, touch screen displays, keyboards, keypads, switches, dials, mice, track balls, voice recognizers, card readers, paper tape readers, printers, video monitors, or other well-known input/output devices.

Figure 2:
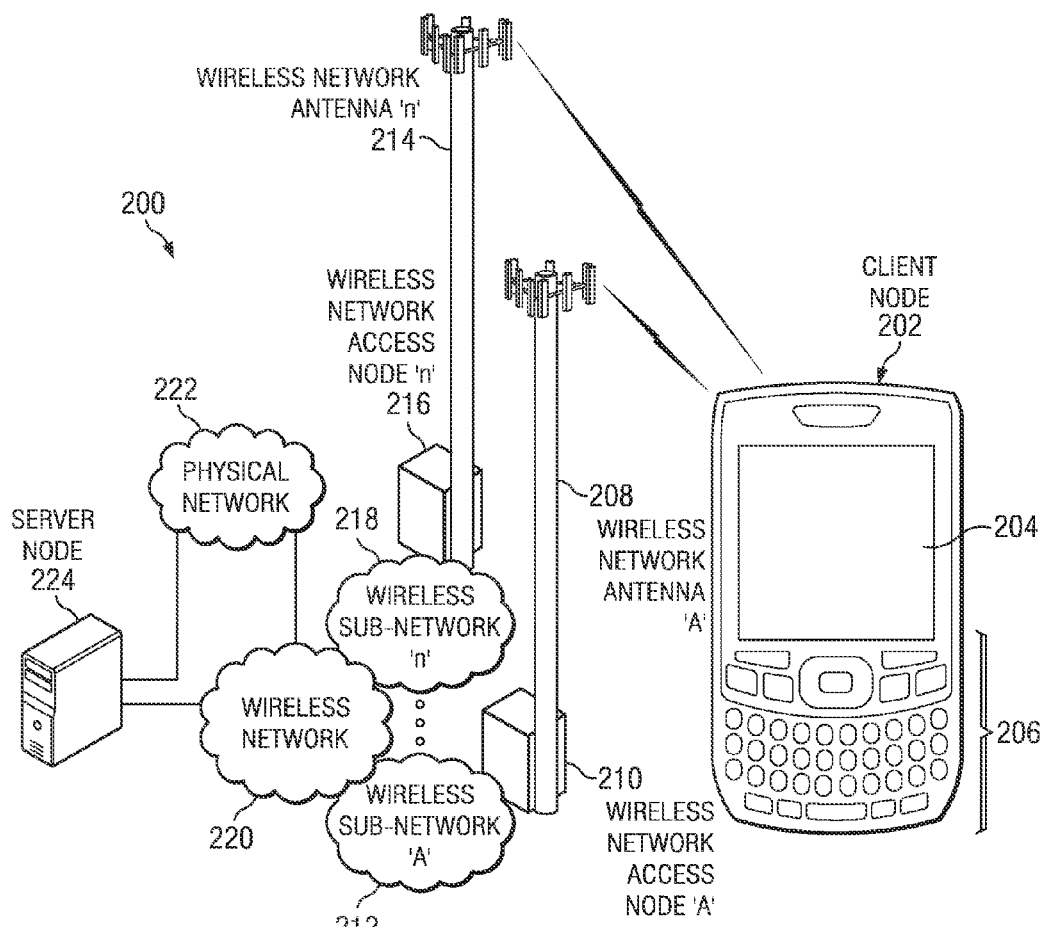
FIG. 2 shows a wireless-enabled communications environment including an embodiment of a client node.

FIG. 2 shows a wireless-enabled communications environment including an embodiment of a client node as implemented in an embodiment of the invention. Though illustrated as a mobile phone, the client node 202 may take various forms including a wireless handset, a pager, a smart phone, or a personal digital assistant (PDA). In various embodiments, the client node 202 may also comprise a portable computer, a tablet computer, a laptop computer, or any computing device operable to perform data communication operations. Many suitable devices combine some or all of these functions. In some embodiments, the client node 202 is not a general purpose computing device like a portable, laptop, or tablet computer, but rather is a special-purpose communications device such as a telecommunications device installed in a vehicle. The client node 202 may likewise be a device, include a device, or be included in a device that has similar capabilities but that is not transportable, such as a desktop computer, a set-top box, or a network node. In these and other embodiments, the client node 202 may support specialized activities such as gaming, inventory control, job control, task management functions, and so forth.

In various embodiments, the client node 202 includes a display 204. In these and other embodiments, the client node 202 may likewise include a touch-sensitive surface, a keyboard or other input keys 206 generally used for input by a user. The input keys 206 may likewise be a full or reduced alphanumeric keyboard such as QWERTY, Dvorak, AZERTY, and sequential keyboard types, or a traditional numeric keypad with alphabet letters associated with a telephone keypad. The input keys 206 may likewise include a trackwheel, an exit or escape key, a trackball, and other navigational or functional keys, which may be inwardly depressed to provide further input function. The client node 202 may likewise present options for the user to select, controls for the user to actuate, and cursors or other indicators for the user to direct.

The client node 202 may further accept data entry from the user, including numbers to dial or various parameter values for configuring the operation of the client node 202. The client node 202 may further execute one or more software or firmware applications in response to user commands. These applications may configure the client node 202 to perform various customized functions in response to user interaction. Additionally, the client node 202 may be programmed or configured over-the-air (OTA), for example from a wireless network access node 'A' 210 through 'n' 216 (e.g., a base station), a server node 224 (e.g., a host computer), or a peer client node 202.

Among the various applications executable by the client node 202 are a web browser, which enables the display 204 to display a web page. The web page may be obtained from a server node 224 through a wireless connection with a wireless network 220. As used herein, a wireless network 220 broadly refers to any network using at least one wireless connection between two of its nodes. The various applications may likewise be obtained from a peer client node 202 or other system over a connection to the wireless network 220 or any other wirelessly-enabled communication network or system.

In various embodiments, the wireless network 220 comprises a plurality of wireless sub-networks (e.g., cells with corresponding coverage areas) 'A' 212 through 'n' 218. As used herein, the wireless sub-networks 'A' 212 through 'n' 218 may variously comprise a mobile wireless access network or a fixed wireless access network. In these and other embodiments, the client node 202 transmits and receives communication signals, which are respectively communicated to and from the wireless network nodes 'A' 210 through 'n' 216 by wireless network antennas 'A' 208 through 'n' 214 (e.g., cell towers). In turn, the communication signals are used by the wireless network access nodes 'A' 210 through 'n' 216 to establish a wireless communication session with the client node 202. As used herein, the network access nodes 'A' 210 through 'n' 216 broadly refer to any access node of a wireless network. As shown in FIG. 2, the wireless network access nodes 'A' 210 through 'n' 216 are respectively coupled to wireless sub-networks 'A' 212 through 'n' 218, which are in turn connected to the wireless network 220.

In various embodiments, the wireless network 220 is coupled to a physical network 222, such as the Internet. Via the wireless network 220 and the physical network 222, the client node 202 has access to information on various hosts, such as the server node 224. In these and other embodiments, the server node 224 may provide content that may be shown on the display 204 or used by the client node processor 110 for its operations. Alternatively, the client node 202 may access the wireless network 220 through a peer client node 202 acting as an intermediary, in a relay type or hop type of connection. As another alternative, the client node 202 may be tethered and obtain its data from a linked device that is connected to the wireless network 212. Skilled practitioners of the art will recognize that many such embodiments are possible and the foregoing is not intended to limit the spirit, scope, or intention of the disclosure.

Figure 3:
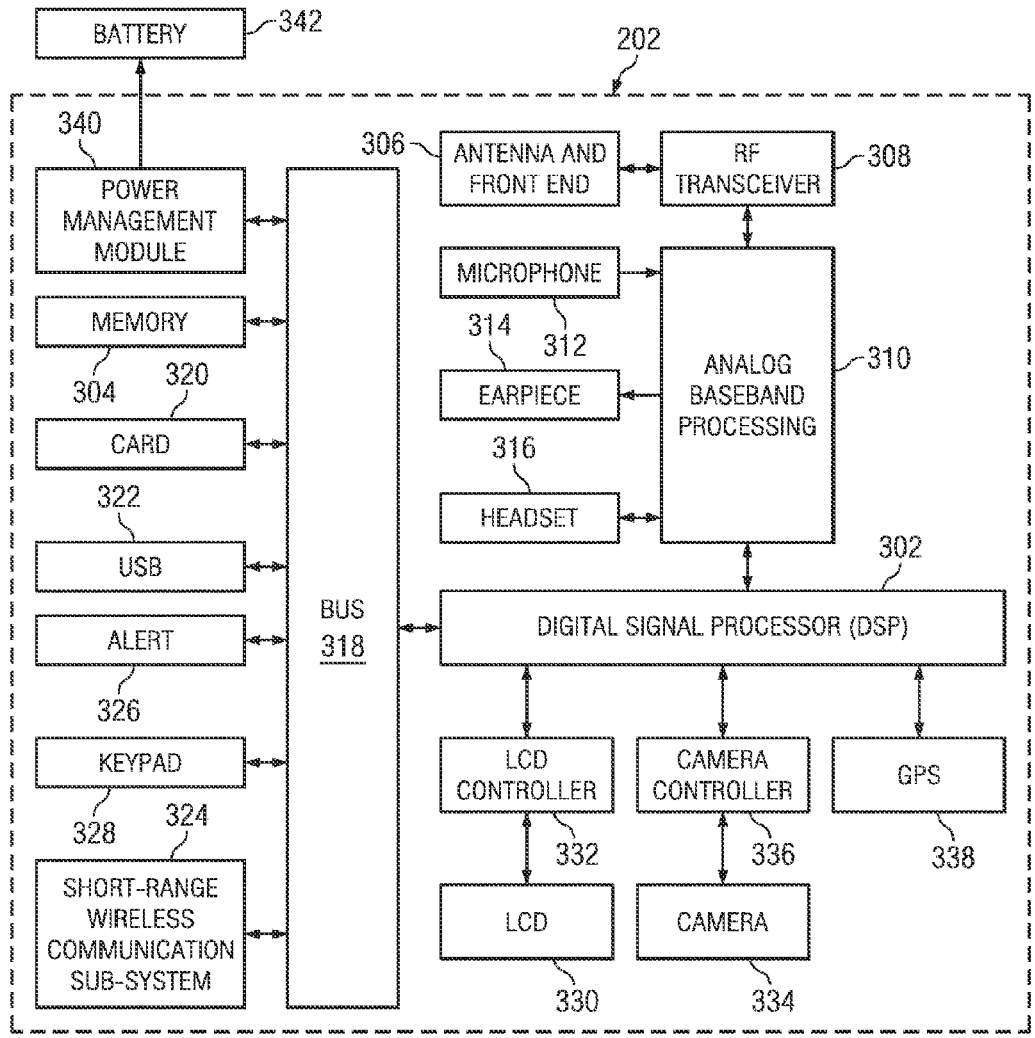
FIG. 3 is a simplified block diagram of an exemplary client node comprising a digital signal processor (DSP)

FIG. 3 depicts a block diagram of an exemplary client node as implemented with a digital signal processor (DSP) in accordance with an embodiment of the invention. While various components of a client node 202 are depicted, various embodiments of the client node 202 may include a subset of the listed components or additional components not listed. As shown in FIG. 3, the client node 202 includes a DSP 302 and a memory 304. As shown, the client node 202 may further include an antenna and front end unit 306, a radio frequency (RF) transceiver 308, an analog baseband processing unit 310, a microphone 312, an earpiece speaker 314, a headset port 316, a bus 318, such as a system bus or an input/output (I/O) interface bus, a removable memory card 320, a universal serial bus (USB) port 322, a short range wireless communication sub-system 324, an alert 326, a keypad 328, a liquid crystal display (LCD) 330, which may include a touch sensitive surface, an LCD controller 332, a charge-coupled device (CCD) camera 334, a camera controller 336, and a global positioning system (GPS) sensor 338, and a power management module 340 operably coupled to a power storage unit, such as a battery 342. In various embodiments, the client node 202 may include another kind of display that does not provide a touch sensitive screen. In one embodiment, the DSP 302 communicates directly with the memory 304 without passing through the input/output interface 318.

In various embodiments, the DSP 302 or some other form of controller or central processing unit (CPU) operates to control the various components of the client node 202 in accordance with embedded software or firmware stored in memory 304 or stored in memory contained within the DSP 302 itself. In addition to the embedded software or firmware, the DSP 302 may execute other applications stored in the memory 304 or made available via information carrier media such as portable data storage media like the removable memory card 320 or via wired or wireless network communications. The application software may comprise a compiled set of machine-readable instructions that configure the DSP 302 to provide the desired functionality, or the application software may be high-level software instructions to be processed by an interpreter or compiler to indirectly configure the DSP 302.

The antenna and front end unit 306 may be provided to convert between wireless signals and electrical signals, enabling the client node 202 to send and receive information from a cellular network or some other available wireless communications network or from a peer client node 202. In an embodiment, the antenna and front end unit 106 may include multiple antennas to support beam forming and/or multiple input multiple output (MIMO) operations. As is known to those skilled in the art, MIMO operations may provide spatial diversity which can be used to overcome difficult channel conditions or to increase channel throughput. Likewise, the antenna and front end unit 306 may include antenna tuning or impedance matching components, RF power amplifiers, or low noise amplifiers.

In various embodiments, the RF transceiver 308 provides frequency shifting, converting received RF signals to baseband and converting baseband transmit signals to RF. In some descriptions a radio transceiver or RF transceiver may be understood to include other signal processing functionality such as modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions. For the purposes of clarity, the description here separates the description of this signal processing from the RF and/or radio stage and conceptually allocates that signal processing to the analog baseband processing unit 310 or the DSP 302 or other central processing unit. In some embodiments, the RF Transceiver 108, portions of the Antenna and Front End 306, and the analog base band processing unit 310 may be combined in one or more processing units and/or application specific integrated circuits (ASICs).

The analog baseband processing unit 310 may provide various analog processing of inputs and outputs, for example analog processing of inputs from the microphone 312 and the headset 316 and outputs to the earpiece 314 and the headset 316. To that end, the analog baseband processing unit 310 may have ports for connecting to the built-in microphone 312 and the earpiece speaker 314 that enable the client node 202 to be used as a cell phone. The analog baseband processing unit 310 may further include a port for connecting to a headset or other hands-free microphone and speaker configuration. The analog baseband processing unit 310 may provide digital-to-analog conversion in one signal direction and analog-to-digital conversion in the opposing signal direction. In various embodiments, at least some of the functionality of the analog baseband processing unit 310 may be provided by digital processing components, for example by the DSP 302 or by other central processing units.

The DSP 302 may perform modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions associated with wireless communications. In an embodiment, for example in a code division multiple access (CDMA) technology application, for a transmitter function the DSP 302 may perform modulation, coding, interleaving, and spreading, and for a receiver function the DSP 302 may perform despreading, deinterleaving, decoding, and demodulation. In another embodiment, for example in an orthogonal frequency division multiplex access (OFDMA) technology application, for the transmitter function the DSP 302 may perform modulation, coding, interleaving, inverse fast Fourier transforming, and cyclic prefix appending, and for a receiver function the DSP 302 may perform cyclic prefix removal, fast Fourier transforming, deinterleaving, decoding, and demodulation. In other wireless technology applications, yet other signal processing functions and combinations of signal processing functions may be performed by the DSP 302.

The DSP 302 may communicate with a wireless network via the analog baseband processing unit 310. In some embodiments, the communication may provide Internet connectivity, enabling a user to gain access to content on the Internet and to send and receive e-mail or text messages. The input/output interface 318 interconnects the DSP 302 and various memories and interfaces. The memory 304 and the removable memory card 320 may provide software and data to configure the operation of the DSP 302. Among the interfaces may be the USB interface 322 and the short range wireless communication sub-system 324. The USB interface 322 may be used to charge the client node 202 and may also enable the client node 202 to function as a peripheral device to exchange information with a personal computer or other computer system. The short range wireless communication sub-system 324 may include an infrared port, a Bluetooth interface, an IEEE 802.11 compliant wireless interface, or any other short range wireless communication sub-system, which may enable the client node 202 to communicate wirelessly with other nearby client nodes and access nodes.

The input/output interface 318 may further connect the DSP 302 to the alert 326 that, when triggered, causes the client node 202 to provide a notice to the user, for example, by ringing, playing a melody, or vibrating. The alert 326 may serve as a mechanism for alerting the user to any of various events such as an incoming call, a new text message, and an appointment reminder by silently vibrating, or by playing a specific pre-assigned melody for a particular caller.

The keypad 328 couples to the DSP 302 via the I/O interface 318 to provide one mechanism for the user to make selections, enter information, and otherwise provide input to the client node 202. The keyboard 328 may be a full or reduced alphanumeric keyboard such as QWERTY, Dvorak, AZERTY and sequential types, or a traditional numeric keypad with alphabet letters associated with a telephone keypad. The input keys may likewise include a trackwheel, an exit or escape key, a trackball, and other navigational or functional keys, which may be inwardly depressed to provide further input function. Another input mechanism may be the LCD 330, which may include touch screen capability and also display text and/or graphics to the user. The LCD controller 332 couples the DSP 302 to the LCD 330.

The CCD camera 334, if equipped, enables the client node 202 to take digital pictures. The DSP 302 communicates with the CCD camera 334 via the camera controller 336. In another embodiment, a camera operating according to a technology other than Charge Coupled Device cameras may be employed. The GPS sensor 338 is coupled to the DSP 302 to decode global positioning system signals or other navigational signals, thereby enabling the client node 202 to determine its position. Various other peripherals may also be included to provide additional functions, such as radio and television reception.

Figure 4:
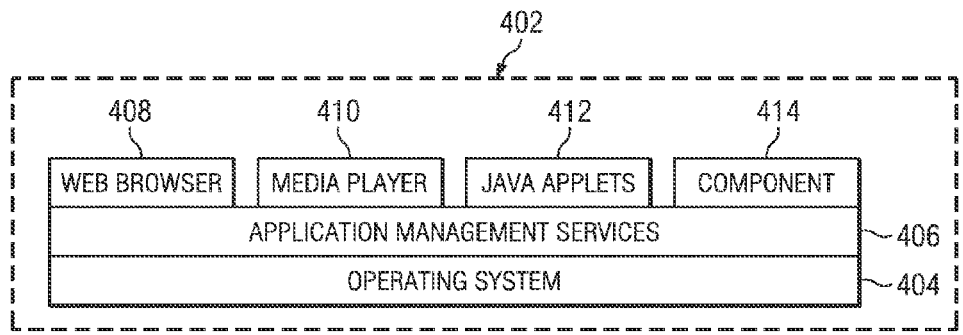
FIG. 4 is a simplified block diagram of a software environment that may be implemented by a DSP.

FIG. 4 illustrates a software environment 402 that may be implemented by a digital signal processor (DSP). In this embodiment, the DSP 302 shown in FIG. 3 executes an operating system 404, which provides a platform from which the rest of the software operates. The operating system 404 likewise provides the client node 202 hardware with standardized interfaces (e.g., drivers) that are accessible to application software. The operating system 404 likewise comprises application management services (AMS) 406 that transfer control between applications running on the client node 202. Also shown in FIG. 4 are a web browser application 408, a media player application 410, and Java applets 412. The web browser application 408 configures the client node 202 to operate as a web browser, allowing a user to enter information into forms and select links to retrieve and view web pages. The media player application 410 configures the client node 202 to retrieve and play audio or audiovisual media. The Java applets 412 configure the client node 202 to provide games, utilities, and other functionality. A component 414 may provide functionality described herein. In various embodiments, the client node 202, the wireless network nodes 'A' 210 through 'n' 216, and the server node 224 shown in FIG. 2 may likewise include a processing component that is capable of executing instructions related to the actions described above.

The present disclosure provides a tunable matching network in a radio frequency receiver system that matches, in real-time, the impedance of an antenna that may change dynamically because of various environmental factors. "Dynamic," as used in this disclosure, means adaptive or continuous changes responsive to a particular event or situation. In this application, "dynamic" refers to continuous changes in reaction to the environment or surroundings. The exact environmental variables that affect the antenna operation are not known or predictable. The impedance of an antenna may dynamically change as a result of a number of different factors, including, but not in any way limited to, antenna orientation and the proximity of the antenna to a number of bodies and objects, including inanimate objects.

"Real-time," as used within this disclosure, refers to the continuous or ongoing processing of information without delay during the operation of hardware, software, or hardware and software. For example, a device or other hardware, software, or hardware/software combination is not considered to be operating in real-time when it is turned off, in a low power mode, a sleep mode, or a standby mode.

The tunable matching network adapts the impedance of an antenna for a particular environment. Specifically, as the environment or the orientation of an antenna within an environment is changed, the input impedance of the antenna is calculated in real-time and the reactive elements of the matching network are calibrated continuously or dynamically to match the calculated input impedance of the antenna and tune the antenna to achieve optimal signal quality.

The input impedance of the antenna is calculated in real-time through solving non-linear equations derived to determine the value of the reflection coefficient of the antenna, Gamma A, $\Gamma_A$. Gamma A is a dynamic parameter of the antenna that changes with proximity to objects within a particular environment. The calculation of Gamma A in real-time allows the input impedance of the antenna to be determined dynamically. One or more reactive elements of the matching network may be adjusted to match the determined input impedance and maximize the power received from the antenna to the receiver system.

A real-time impedance measurement technique was previously disclosed in U.S. patent application Ser. No. 12/579,381, filed Oct. 14, 2009, titled "Dynamic Real-Time Calibration for Antenna Matching in a Radio Frequency Receiver System," which by this reference is incorporated herein for all purposes. The technique disclosed in the above-referenced patent application was based on composing two non-linear equations based on three received power measurements, $P^1_L$, $P^2_L$, $P^3_L$. The received power measured at the terminal of the matching circuit that couples the antenna to a feed source is a function of the components that compose the matching circuit, i.e., inductors and capacitors, through the circuit's S-parameters, the operating frequency f, and the antenna's input reflection coefficient. This relationship is shown below in equation 1:

$$P_L = \frac{|V_A|^2}{8Z_o}|S_{21}|^2 \frac{(1-|\Gamma_L|^2)|1-\Gamma_A|^2}{|1-S_{22}\Gamma_L|^2|1-\Gamma_A\Gamma_{in}|^2}. \tag{1}$$

Using these three pieces of information, and utilizing equation (1), two non-linear equations (2) and (3) are composed and solved for the antenna input impedance, $\Gamma_A$.

$$\frac{P^{(3)}_L}{P^{(1)}_L} = \frac{|S^{(3)}_{21}|^2|1-S^{(1)}_{22}\Gamma_L|^2|1-\Gamma_A\Gamma^{(1)}_{in}|^2}{|S^{(1)}_{21}|^2|1-S^{(3)}_{22}\Gamma_L|^2|1-\Gamma_A\Gamma^{(3)}_{in}|^2}, \tag{2}$$

and $$\frac{P^{(2)}_L}{P^{(1)}_L} = \frac{|S^{(2)}_{21}|^2|1-S^{(1)}_{22}\Gamma_L|^2|1-\Gamma_A\Gamma^{(1)}_{in}|^2}{|S^{(1)}_{21}|^2|1-S^{(2)}_{22}\Gamma_L|^2|1-\Gamma_A\Gamma^{(2)}_{in}|^2}. \tag{3}$$

The antenna input impedance, $\Gamma_A$, can be obtained from the relationship shown below in equation (4):

$$\Gamma_A = \frac{Z_A - Z_o}{Z_A + Z_o}, \quad (4)$$

where Zo is the characteristic impedance, usually of 50 ohms.

Figure 5:
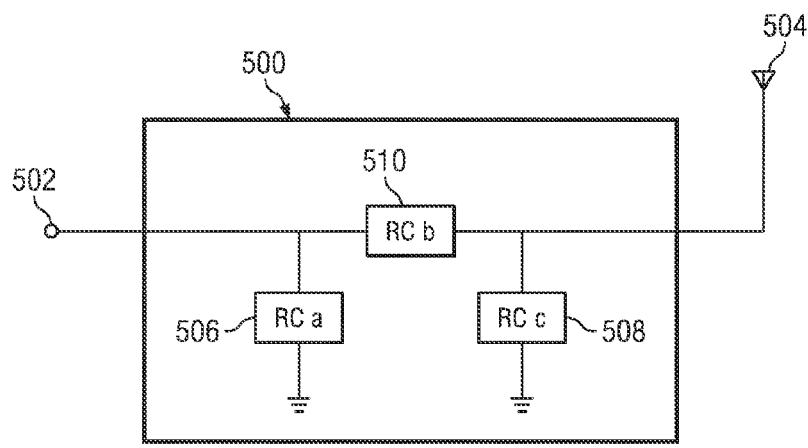
FIG. 5 is an illustration of a matching circuit that can be used to implement embodiments of the disclosure.

FIG. 5 is an illustration of a typical matching circuit 500 that can be used to implement embodiments of the disclosure. The matching circuit is operable to process input signals from a feed source 502 to provide load matching for an antenna 504. The embodiment shown in FIG. 5 comprises three reactive components (RC) RC a, RC b, and RC c, designated by reference numerals 506, 508, and 510, respectively. As will be understood by those of skill in the art, the reactive components may be a combination of inductors or capacitors. Although three reactive components are shown in FIG. 5, various embodiments of the disclosure can be implement using a different number of reactive components. In some embodiments of the disclosure the reactive components have a fixed value. However, in other embodiments, discussed below, the values of the reactive components may be variable.

Figure 6:
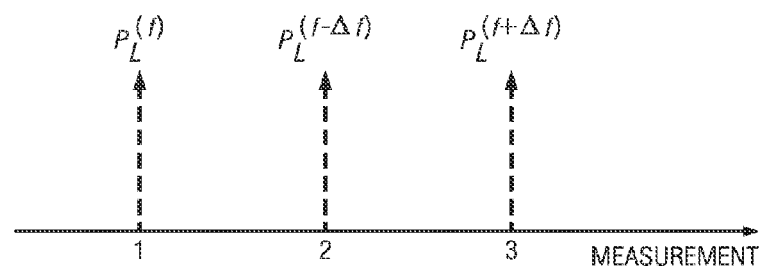
FIG. 6 is an illustration of example power measurements obtained using frequency perturbation techniques in accordance with an embodiment of the disclosure.

At the operating frequency, f, a load measurement $P_L^{(f)}$ is made. This step is repeated for two more measurements at the same measurement location by perturbing the frequency in $\Delta f$ steps to $f+\Delta f$ and $f-\Delta f$. The corresponding load powers $P_L^{(f+\Delta f)}$ and $P_L^{(f-\Delta f)}$ are then measured. Example power measurements are shown generally in FIG. 6. Using the aforementioned information, two non-linear equations (5) and (6) (modifications of equations (2) and (3) above) are then constructed and solved for $\Gamma_A$.

$$\frac{P_L^{(f+\Delta f)}}{P_L^{(f)}} = \frac{|S_{21}^{(f+\Delta f)}|^2 |1 - S_{22}^{(f)}\Gamma_L|^2 |1 - \Gamma_A \Gamma_{in}^{(f)}|^2}{|S_{21}^{(f)}|^2 |1 - S_{22}^{(f+\Delta f)}\Gamma_L|^2 |1 - \Gamma_A \Gamma_{in}^{(f+\Delta f)}|^2}, \quad (5)$$

and $$\frac{P_L^{(f-\Delta f)}}{P_L^{(f)}} = \frac{|S_{21}^{(f-\Delta f)}|^2 |1 - S_{22}^{(f)}\Gamma_L|^2 |1 - \Gamma_A \Gamma_{in}^{(f)}|^2}{|S_{21}^{(f)}|^2 |1 - S_{22}^{(f-\Delta f)}\Gamma_L|^2 |1 - \Gamma_A \Gamma_{in}^{(f-\Delta f)}|^2}. \quad (6)$$

In some embodiments, the aforementioned power measurements are the total received power. In other embodiments, the power measurements may correspond to a desired user power component of the total received power. In addition, each of the three power measurements used in the aforementioned equations may be obtained by averaging power measurements at the various $\Delta f$ steps.

Three illustrative examples of the present disclosure for implementing the techniques discussed above will now be discussed:

Example 1

Figure 7:
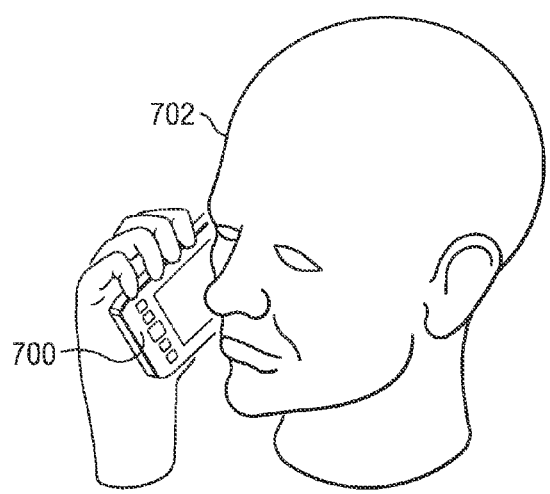
FIG. 7 is a general illustration of a wireless handset held adjacent to a user's head 702.
Figure 8:
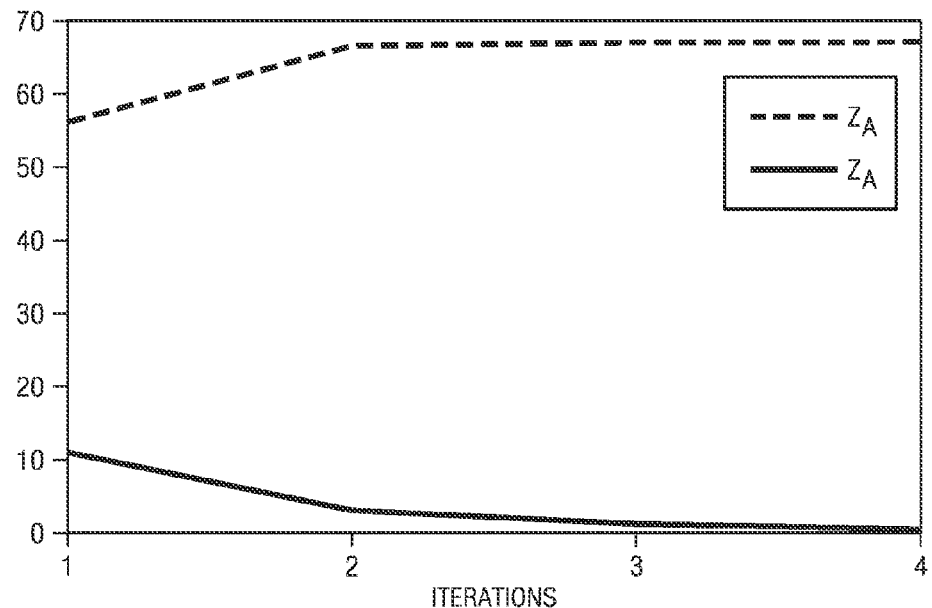
FIG. 8 is a graphical representation of antenna input impedance for the example shown in FIG. 7.

An inverted F antenna (IFA) in voice usage mode. FIG. 7 is a general illustration of a wireless handset 700 held adjacent to a user's head 702 (shown in phantom). In this example, a frequency of f=2.6 GHz is used. Equations (2)-(4) are solved with the measured received powers at $\Delta f$=100 MHz perturbations in frequency. The iterations to reach the solution of equations (2) and (3) are shown in FIG. 8. The actual input impedance of the antenna is successfully recovered to be $Z_A$=67+j0.4 Ohms. The free-space input impedance 56+j11 Ohms is used as the initial guess to the numerical solver.

Figure 9:
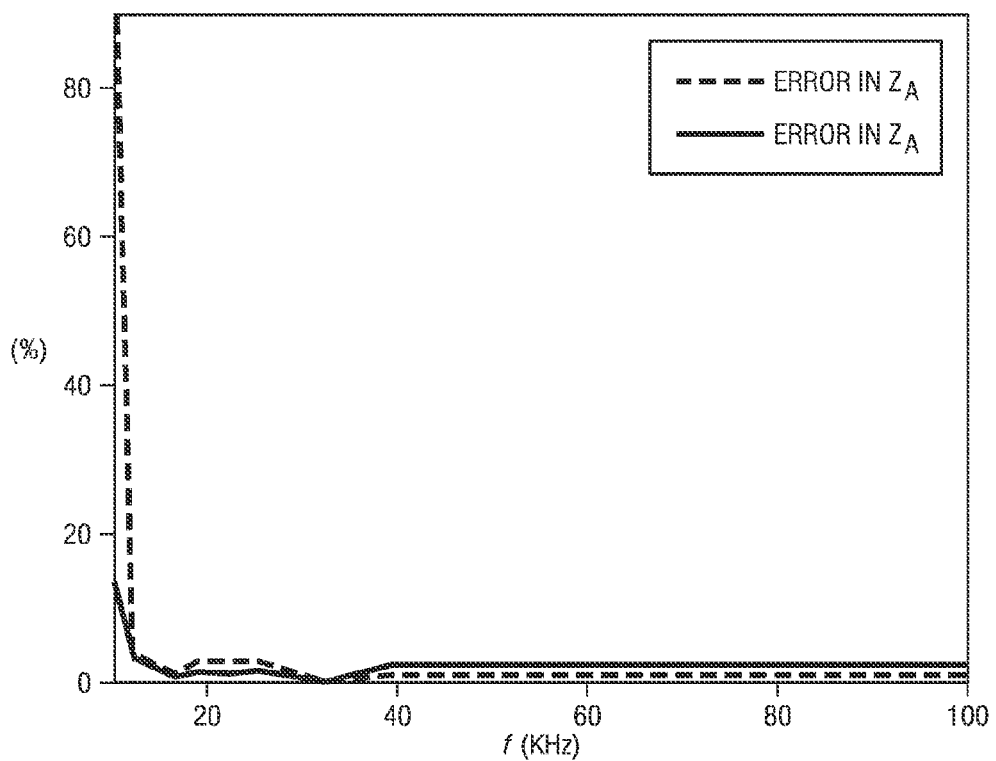
FIG. 9 shows the error in the computed antenna input impedance as a function of the perturbation bandwidth $\Delta f$ for the example shown in FIG. 7.

For practical implementation, $\Delta f$ needs to be such that all three measurements occur in one communication interval. Therefore, the same example is calculated with $\Delta f$=10 KHz, which would work with the bandwidth for GSM applications. The solution of the two equations yielded an impedance value of ZA=57.7+j20.6Ω. When repeated with an LTE application in mind for $\Delta f$=5 MHz (and assuming an LTE carrier bandwidth of 20 MHz), the exact impedance value was achieved. FIG. 9 shows the error in the computed antenna impedance as a function of the perturbation bandwidth $\Delta f$.

Example 2

Figure 10:
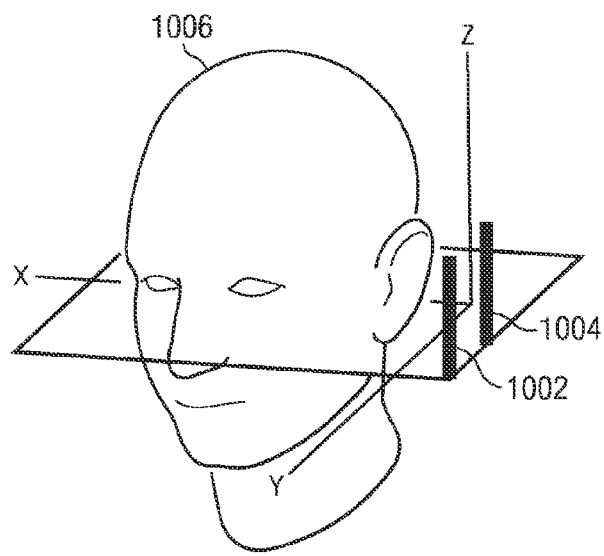
FIG. 10 is a general illustration of two dipole antennas near a user's head.
Figure 11:
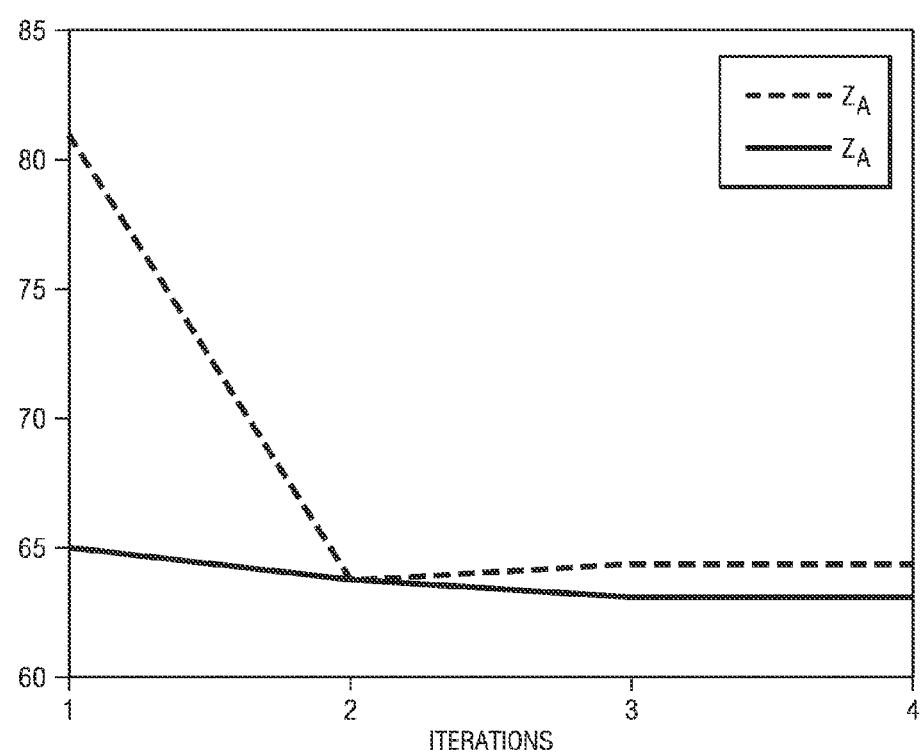
FIG. 11 is a graphical illustration of the computed antenna input impedance for the example shown in FIG. 10.

Two dipole antennas near a phantom head. FIG. 10 is a general illustration of two dipole antennas 1002 and 1004 near a phantom head 1006. In this example, two dipole antennas operating at a frequency of 1.88 GHz are considered. The initial antenna impedance guess assumed is 81+j65Ω. The perturbations in frequency are made in $\Delta f$=100 MHz steps. The process for solving the system of equations is shown in FIG. 11. The actual complex input impedance of the antenna $Z_A$=64.4+j63.4Ω is successfully achieved.

Figure 12:
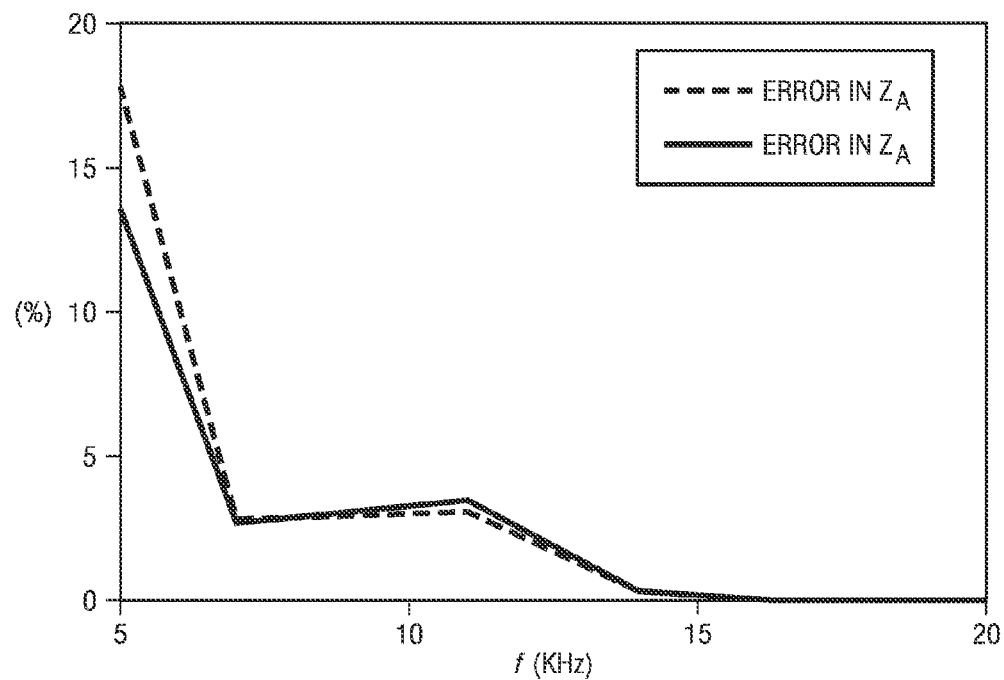
FIG. 12 shows the error in the computed antenna input impedance as a function of the perturbation bandwidth $\Delta f$ for the example shown in FIG. 10.

The same example was run with $\Delta f$=10 KHz for consideration of GSM applications. The solution of the two equations came to the approximate impedance value of ZA=77.1+j61.4Ω. When repeated with an LTE application in mind for $\Delta f$=5 MHz, the exact impedance value was achieved. FIG. 12 shows the error in the computed antenna impedance as a function of the perturbation bandwidth $\Delta f$.

Example 3

Figure 13:
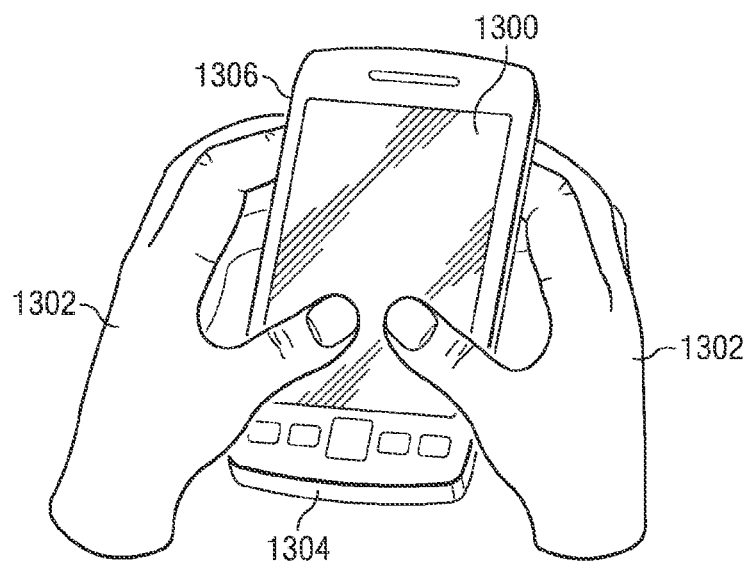
FIG. 13 shows a communication device comprising an inverted-F antenna with the device being held in a user's hands.

Inverted F antenna used in "data mode." FIG. 13 is a general illustration of a wireless device 1300 being held in a user's hands, illustrated generally by reference numeral 1302. The wireless device shown in FIG. 13 comprises a first antenna 1304 disposed on the lower edge of the device and a second antenna 1306 disposed on the left edge of the device. As will be understood by those of skill in the art, the antennas 1304 and 1306 are oriented in an orthogonal configuration. In various embodiments of the disclosure, the antennas 1304 and 1306 can be inverted F antennas configured for use in a multiple-input-multiple-output (MIMO) system.

In this example, it is assumed that the antennas operate at a frequency of 2.5 GHz and the wireless device is operating in the presence of human hands as shown in FIG. 13. In this example the actual input impedance of the antenna is calculated to be $Z_A$=60.69-j6.3Ω. The input impedance of the antenna in free space (60.27-j7.20Ω) is used as an initial guess.

Figure 14:
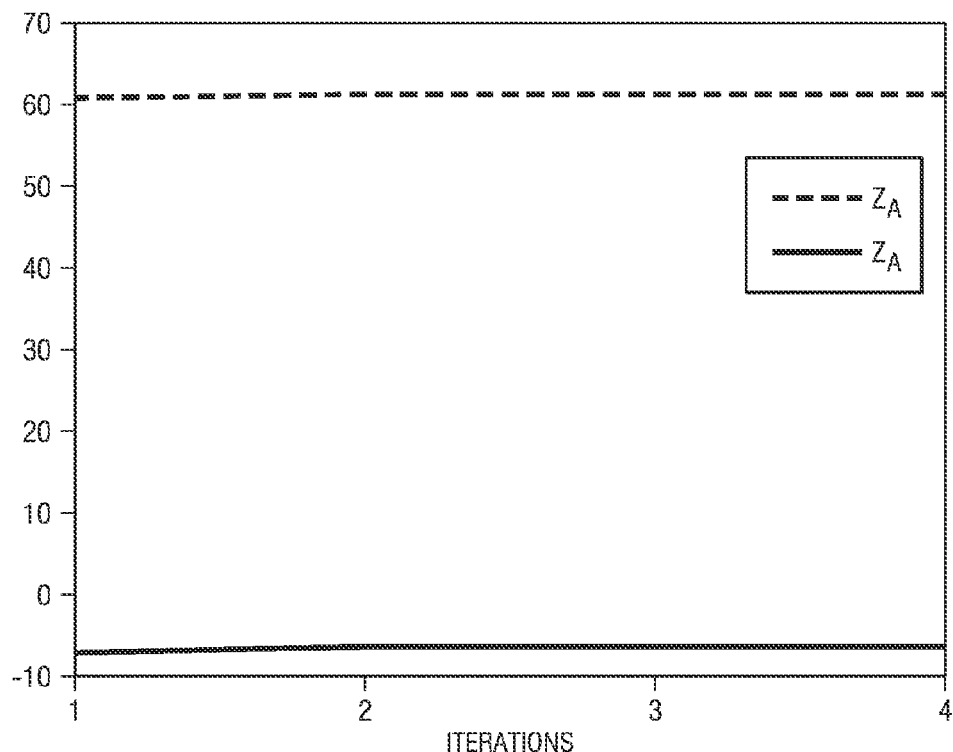
FIG. 14 is a graphical representation of antenna input impedance for the example shown in FIG. 13.
Figure 15:
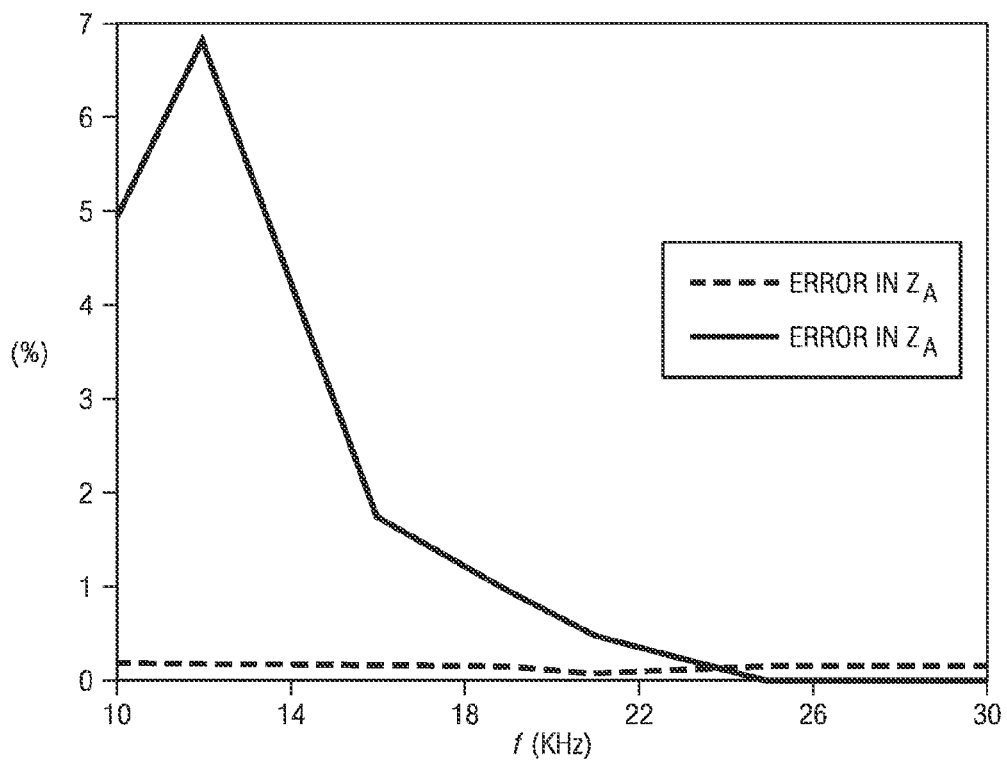
FIG. 15 is a graphical illustration of the error in the computed impedance as a function of the perturbation bandwidth for the calculations performed for the example shown in FIG. 13.

FIG. 14 is a graphical illustration of the solution process using the techniques described herein. This example shows that the approach described herein does not generate an incorrect value if there is no change measured in the antenna impedance from the previous computation. FIG. 15 is a graphical illustration of the error in the computed impedance as a function of the perturbation bandwidth for the calculations performed in Example 3.

Figure 16:
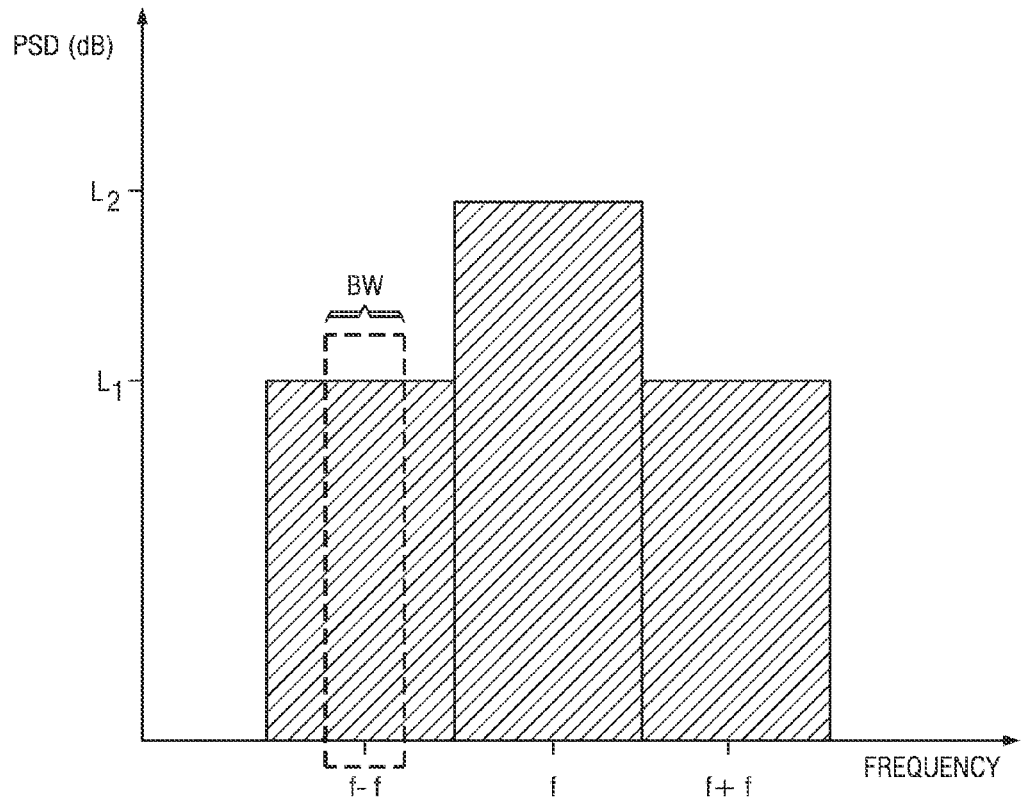
FIG. 16 is an illustration of non-uniform signal power spectral density for communication systems implementing embodiments of the disclosure.

The previous analysis is based on the assumption that the received power observed at the base of the antenna being the same at frequencies f-$\Delta f$, f, and f+$\Delta f$. Assuming a fixed impedance value, if there is a natural change in the received power change at these three frequencies then power measurements used in equations (2) and (3) must be normalized for an accurate comparison. The basis for this normalization can be seen be referring to the spectral density illustration in FIG. 16.

As shown, power measurements in the region of f are made on a portion of the signal that has a power spectral density $L_2-L_1$ dB greater than for measurements in made in the regions $f-\Delta f$ or $f+\Delta f$. Therefore, to properly compare power measurements of $P_1/P_3$ centered on $f-\Delta f/f+\Delta f$ with measurements of $P_2$ centered on f, the measurements of $P_2$ must be adjusted by $L_2-L_1$ dB.

Figure 17:
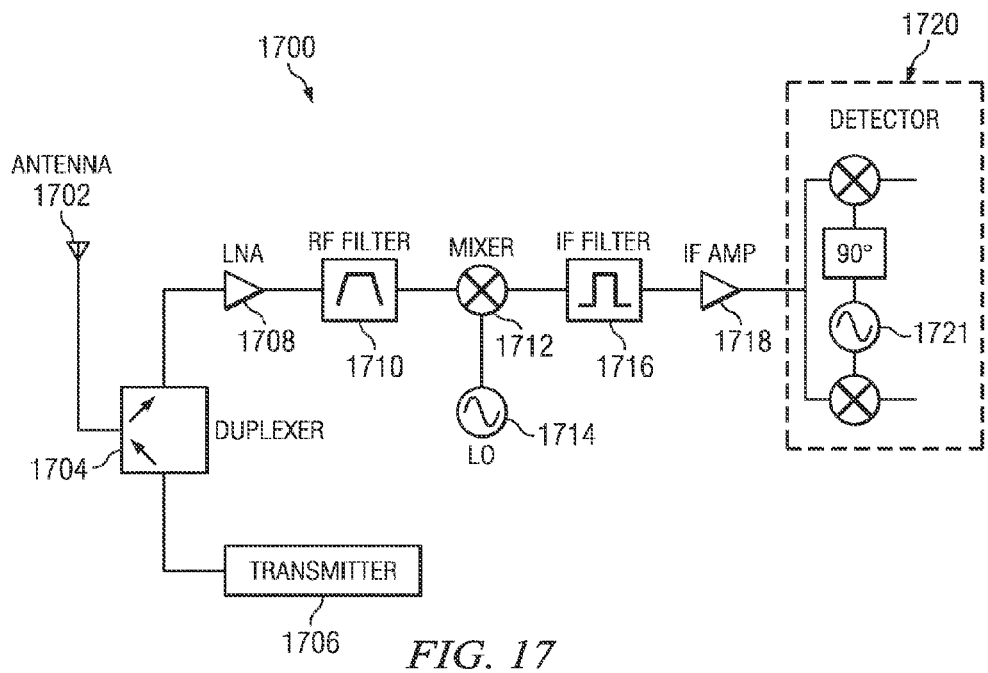
FIG. 17 is an illustration of a communication system comprising functional components for processing signals in accordance with embodiments of the disclosure.

FIG. 17 is an illustration of a communication system 1700 comprising functional components for processing signals in accordance with the techniques discussed herein. Antenna 1702 is coupled to a duplexer 1704 that is further coupled to a transmitter 1706 and to a plurality of components comprising the receiver portion of the system. Incoming signals are passed from the duplexer to a low noise amplifier (LNA) 1708 that generates amplified signal that are passed to a radio frequency (RF) filter 1710. The RF filter 1710 is operable to filter the received signals and to provide a predetermined passband of the received RF signals to the mixer 1712. The mixer 1712 mixes the RF signals with a lower frequency signal generated by a local oscillator to generate a set of intermediate frequency (IF) signals. The IF signals are filtered by IF filter 1716 to generate a predetermined set of intermediate frequency signals that are then amplified by IF amplifier 1718 and passed to detector 1720 for further processing.

In one embodiments of the invention, the power sensing of the three needed power measurements is performed at baseband. The $\Delta f$ perturbations are accomplished by a shift in frequency using either local oscillator 1714 or local oscillator 1721.

In the implementation of the various embodiments, the response of the matching circuit should be versatile in the range of $2\Delta f$ to ensure accurate power measurements. This can be accomplished by "mismatching" the fixed matching circuit by switching a component in or out of the circuit. As can be understood from FIGS. 9, 12 and 15, the accuracy of the techniques described herein improves with the increase in the frequency step size $\Delta f$. The examples discussed herein show that exact values of the impedance can be achieved with a $\Delta f$ of 15 KHz. In some GSM applications, reasonable accuracy can be achieved with a $\Delta f$ of 10 KHz and in some LTE applications, accurate impedance measurements may be possible with $\Delta f$ of 5 KHz.

In the embodiments discussed hereinabove, all of the impedance measurements have been accomplished by using only frequency perturbations. In an alternate embodiment of the disclosure, the input impedance of an antenna can be obtained by using a combination of frequency perturbation and component perturbation techniques.

Figure 18:
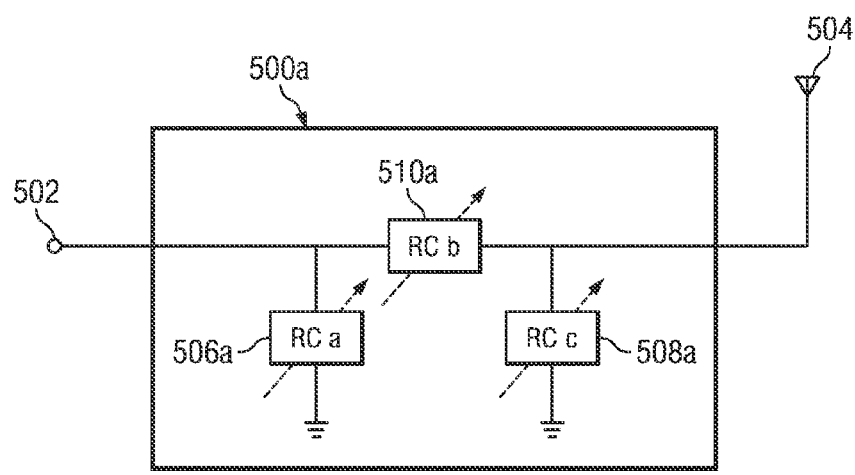
FIG. 18 is an illustration of a tuning circuit that is a modified version of the tuning circuit shown in FIG. 5.

FIG. 18 is an illustration of a tuning circuit 500a that is a modified version of the tuning circuit shown in FIG. 5. In the tuning circuit shown in FIG. 18, the reactive components 506a, 508a and 510a are variable, rather than having a fixed value. In this embodiment, the received power measurements will be expressed as "power parameters" corresponding to received power measurements made with frequency perturbations of the tuning circuit 500a and with the reactive components in the tuning circuit 500a having variable values.

Although implementation of this embodiment may be accomplished by varying the values of any of the reactive components, or any combination of the reactive components, examples will be discussed wherein reactive component 508a is a capacitor having a capacitance, C, and the value of the reactive element is varied by an amount, $\Delta C$. In this example a first power parameter corresponds to a power measurement, $P_L^1$ made at the operating frequency with the reactive component 508a set to a first predetermined value, C. The second power parameter corresponds to a power measurement, $P_L^2$, made at the operating frequency, f, but with the reactive component 508a set to a value of $C+\Delta C$. The third power parameter corresponds to a power measurement, $P_L^3$ made with the reactive component 508a set to $C+\Delta C$, and with the frequency set either to $f-\Delta f$ or $f+\Delta f$.

Using this technique, equations (2) and (3) will be of the form shown below in equations (7) and (8):

$$\frac{P_L^{(S_{C2\pm\Delta C2})}}{P_L^{(S)}} = \frac{|S_{21}^{(S_{C2\pm\Delta C2})}|^2 |1-S_{22}^{(S)}\Gamma_L|^2 |1-\Gamma_A\Gamma_{in}^{(S)}|^2}{|S_{21}^{(S)}|^2 |1-S_{22}^{(S_{C2\pm\Delta C2})}\Gamma_L|^2 |1-\Gamma_A\Gamma_{in}^{(S_{C2\pm\Delta C2})}|^2}, \quad (7)$$

and $$\frac{P_L^{(f\pm\Delta f)}}{P_L^{(S)}} = \frac{|S_{21}^{(f\pm\Delta f)}|^2 |1-S_{22}^{(S)}\Gamma_L|^2 |1-\Gamma_A\Gamma_{in}^{(S)}|^2}{|S_{21}^{(S)}|^2 |1-S_{22}^{(f\pm\Delta f)}\Gamma_L|^2 |1-\Gamma_A\Gamma_{in}^{(f\pm\Delta f)}|^2}. \quad (8)$$

Figure 19:
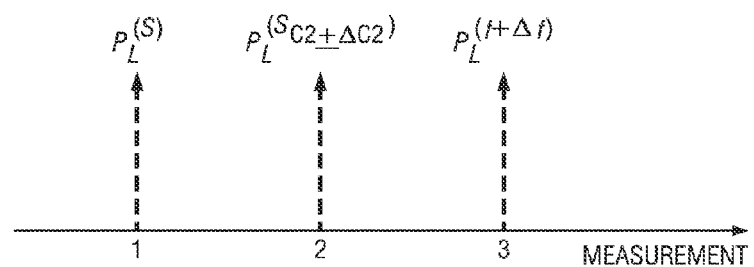
FIG. 19 is an illustration of a sequence of power measurements obtained using the data processing techniques in accordance with embodiments of the disclosure.

FIG. 19 is an illustration of a sequence of power measurements obtained using the relationships discussed above and the processing steps discussed previously in connection with other embodiments of the disclosure.

Figure 20:
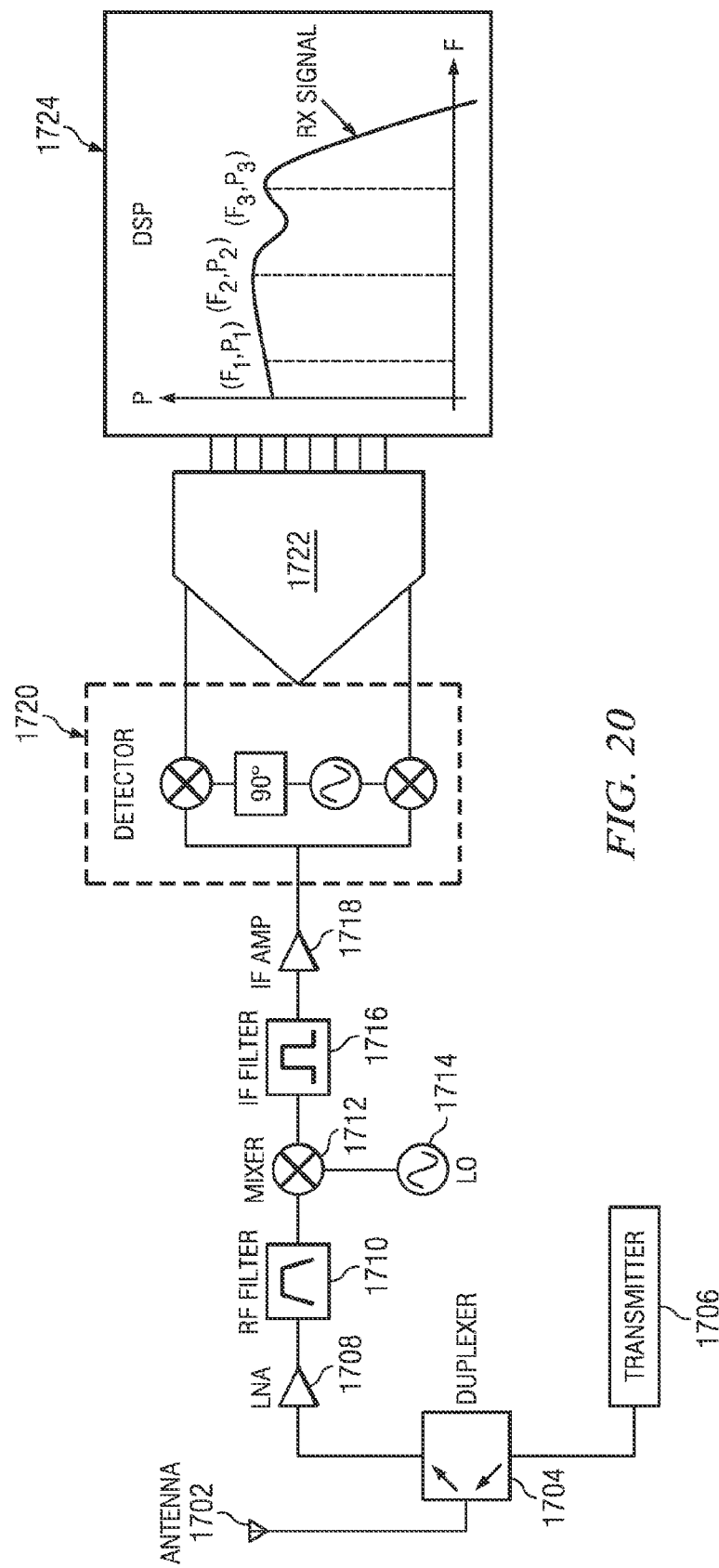
FIG. 20 is a block diagram representation of a system for implementing embodiments of the disclosure using digital signal processing techniques.

In yet another embodiment, the perturbation in frequency is performed at digital baseband. This embodiment, the tuning of the equations' frequency component is performed as the equivalent of the frequency perturbation discussed above, but is performed in DSP at digital baseband. The equations and analyses are the same as discussed hereinabove in connection with other embodiments. FIG. 20 is a block diagram representation of a system for implementing this embodiment. This system comprises all of the components discussed above in connection FIG. 17 and also includes an analog-to-digital converter 1722 that converts analog baseband signals from the detector 1720 into digital signals that can be processed by the DSP 1724. This system uses signal processing techniques known to those of skill in the art to perform frequency translation, Fast Fourier Transforming (FFT) and digital filtering. The DSP 1724 can be configured to analyze incoming signals at frequencies offset from the received center of band, effectively performing frequency perturbations comparable to those discussed above with regard to other embodiments of the disclosure.

Although the described exemplary embodiments disclosed herein are described with reference to estimating the impedance of antennas in wireless devices, the present disclosure is not necessarily limited to the example embodiments which illustrate inventive aspects of the present invention that are applicable to a wide variety of authentication algorithms. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A wireless communications system, comprising:
   an antenna;
   a matching circuit coupled to said antenna, said matching circuit having an operating frequency;

a control system operable to calculate, in real-time, a value for an input impedance of the antenna, wherein said input impedance is calculated based on a first received power measurement corresponding to said matching circuit tuned at said operating frequency, a second received power measurement corresponding to said matching circuit tuned at a first perturbed frequency equal to the operating frequency minus a frequency perturbation step interval, and a third received power measurement corresponding to said matching circuit tuned at a second perturbed frequency equal to the operating frequency plus the frequency perturbation step interval.

2. The wireless communications system of claim 1, wherein said first, second, and third received power measurements, respectively, each comprise the total received power.

3. The wireless communications system of claim 1, wherein said first, second, and third received power measurements, respectively, each correspond to a desired user power.

4. The wireless communications system of claim 1, wherein one of said first, second, and third received power measurements are obtained by averaging a collective set of power measurements.

5. The wireless communications system of claim 1, wherein said matching network is tunable by the control system to match the calculated values of the input impedance of the antenna to a load on a receiver in said communication system.

6. The wireless communications system of claim 1, wherein said matching network comprises reactive components having fixed values.

7. The wireless communications system of claim 1, wherein said first, second, and third received power measurements are normalized to compensate for received power variations corresponding to spectral power densities for the measurement frequencies for each of the three respective power measurements.

8. The wireless communications system of claim 1, wherein said frequency perturbation step interval is implemented by controlling the frequency generated by a local oscillator in a detector of a receiver, prior to the baseband stage, in said communication system.

9. The wireless communications system of claim 8, wherein the power sensing of said first, second, and third received power measurements, respectively, is performed at the baseband frequency of the receiver in said communication system.

10. A method for processing signals received on a wireless communications system, the method comprising:
receiving a signal on an antenna coupled to said wireless communication system;
providing said received signal to a matching circuit coupled to said antenna, said matching circuit having an operating frequency; and
using a control system operable to calculate, in real-time, a value for an input impedance of the antenna to match a load in a receiver system, wherein said input impedance is calculated based on a first received power measurement corresponding to said matching circuit tuned at said operating frequency, and a second received power measurement corresponding to said matching circuit tuned at a first perturbed frequency equal to the operating frequency minus a frequency perturbation step interval, and a third received power measurement corresponding to said matching circuit tuned at a second perturbed frequency equal to the operating frequency plus the frequency perturbation step interval.

11. The method of claim 10, wherein said matching network is tunable by the control system to match the calculated values of the input impedance of the antenna to a load on a receiver in said communication system.

12. The method of claim 10, wherein said matching network comprises reactive components having fixed values.

13. The method of claim 12, wherein said first, second, and third received power measurements are normalized to compensate for received power variations corresponding to spectral power densities for the measurement frequencies for each of the three respective power measurements.

14. The method of claim 10, wherein said frequency perturbation step interval is implemented by controlling the frequency generated by a local oscillator in a detector of a receiver, prior to the baseband stage, in said communication system.

15. The method of claim 14, wherein the power sensing of said first, second, and third received power measurements, respectively, is performed at the baseband frequency of the receiver in said communication system.

16. A wireless communications system, comprising:
an antenna;
a matching circuit coupled to said antenna, said matching circuit having an operating frequency;
a control system operable to calculate, in real-time, a value for an input impedance of the antenna using first, second and third power parameters corresponding to first, second and third received power measurements, wherein:
said first power parameter corresponds to a received power measurement obtained with said matching circuit being tuned at said operating frequency and a reactive component in said matching circuit having a first reactive component value;
said second power parameter corresponds to a received power measurement obtained with said matching circuit operating at perturbed frequencies corresponding to one of the operating frequency minus a frequency perturbation step interval or the operating frequency plus the frequency perturbation step interval; and
said third power parameter corresponds to a received power measurement obtained with said matching circuit operating with said reactive component having a value equal to said first reactive component value plus an incremental reactive component value.

17. The wireless communications system of claim 16, wherein said matching network is tunable by the control system to match the calculated values of the input impedance of the antenna to a load on a receiver in said communication system.

18. The wireless communications system of claim 16, wherein said first, second, and third power parameters are normalized to compensate for received power variations corresponding to spectral power densities for the measurement frequencies for each of the three respective power measurements.

19. The wireless communications system of claim 16, wherein said frequency perturbation step interval is implemented by controlling the frequency generated by a local oscillator in a detector of a receiver, prior to the baseband stage, in said communication system.

20. The wireless communications system of claim 19, wherein the power sensing of said first, second, and third power parameters, respectively, is performed at the baseband frequency of the receiver in said communication system.

* * * * *